(12) United States Patent
Willson et al.

(10) Patent No.: US 6,709,701 B2
(45) Date of Patent: Mar. 23, 2004

(54) METHOD FOR A TRAY EXCHANGE DURING CONTINUOUS PRODUCTION OF DISKS

(75) Inventors: Richard F. Willson, Hudson, WI (US); Gregory D. Roberts, Breckenridge, MN (US)

(73) Assignee: Imation Corp., Oakdale, MN (US)

( * ) Notice: Subject to any disclaimer, the term of this patent is extended or adjusted under 35 U.S.C. 154(b) by 154 days.

(21) Appl. No.: 10/117,296

(22) Filed: Apr. 5, 2002

(65) Prior Publication Data

US 2003/0190421 A1 Oct. 9, 2003

(51) Int. Cl.[7] ............................................... C23C 14/56
(52) U.S. Cl. ................. 427/248.1; 427/251; 427/255.5; 414/331.02; 414/332; 204/192.1
(58) Field of Search ............................. 427/248.1, 251, 427/255.5; 414/331.02, 332; 204/192.1, 298.02, 298.15, 298.23, 298.26, 298.28; 118/730, 500

(56) References Cited

U.S. PATENT DOCUMENTS 4,886,592 A * 12/1989 Anderle et al. ........ 204/298.25
5,612,068 A * 3/1997 Kempf et al. ................ 425/574

FOREIGN PATENT DOCUMENTS

JP          10312589 A    *  11/1998  ............ G11B/7/26

* cited by examiner

*Primary Examiner*—Timothy Meeks
(74) *Attorney, Agent, or Firm*—Eric D. Levinson

(57) ABSTRACT

A method of exchanging a thin film coated tray (30) for a clean tray (30) is provided. The method replaces the tray (30) at an intermediate position on the handler (10) and not at an intermediate disk loading position of the rotating disk loading mechanism.

2 Claims, 1 Drawing Sheet

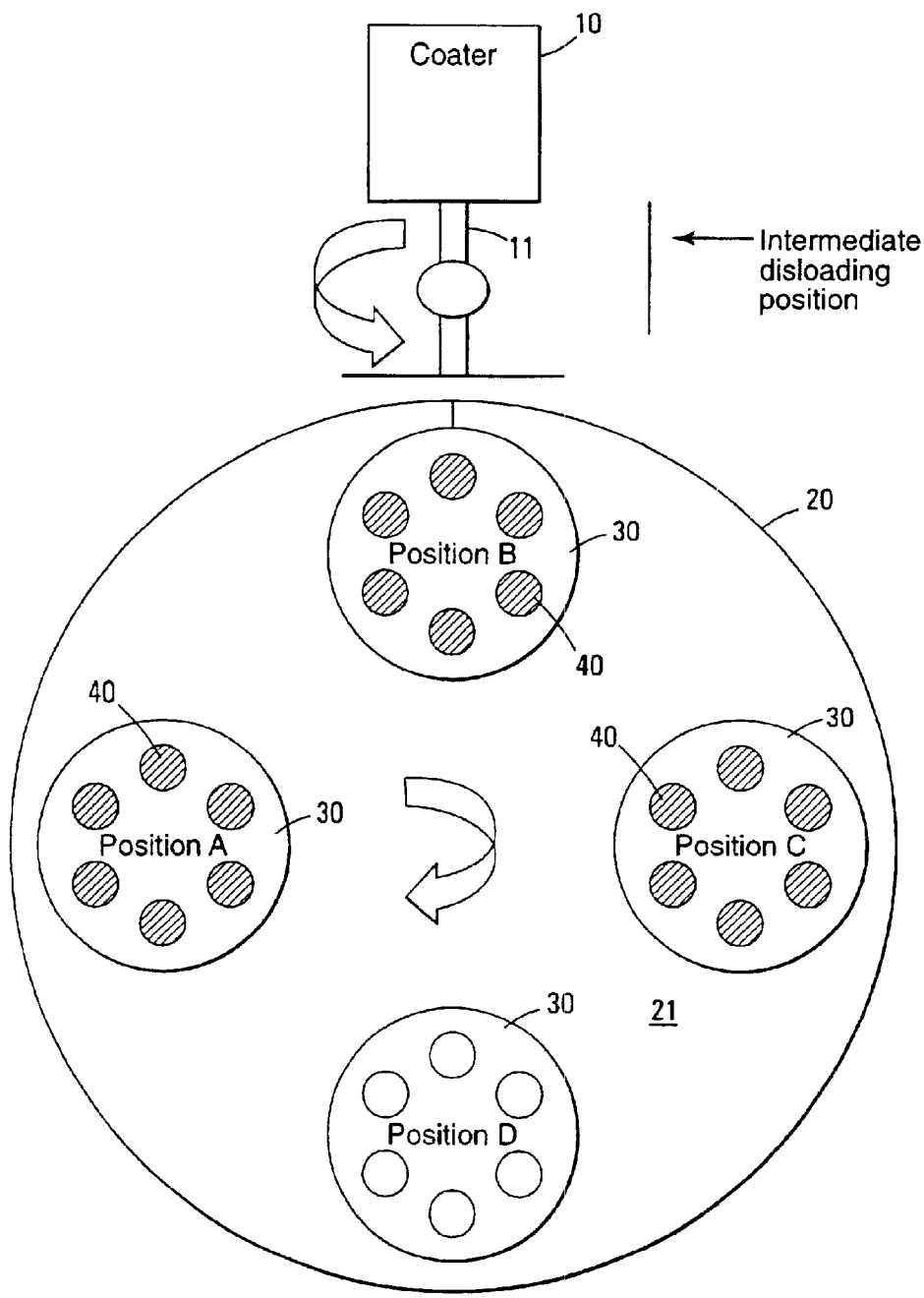

METHOD FOR A TRAY EXCHANGE DURING CONTINUOUS PRODUCTION OF DISKS

BACKGROUND OF THE INVENTION

1. Field of the Invention

This invention relates generally to a method of continuous production of disks that have a thin film coat and more particularly to a method of exchanging a disk tray after a film buildup has occurred without interrupting production of the couture.

2. Description of the Prior Art

Media disks are coated with a thin film by coaters, well known in the art. Such coaters include the Unaxis Big Sprinter Coater manufactured by Unaxis, located at Balzers, Liechtenstein. The thin film coaters have an automated disk loader mechanism. This disk loader mechanism has a double ended transfer arm that transfers a single disk with metal ID and OD masks from the vacuum coater to a position where the thin film coated disk can be picked from the ID and OD masks and replaced with an uncoated disk. The removal of the thin film coated disk from this position and replacement of it with a not thin film coated disk can be done by human hand but is typically done by external automated disk handling equipment that is not part of the disk coater. On each thin film machine cycle the thin film coated disk is replaced with an uncoated disk. The ID and OD metallic masks are not replaced until thin film coatings have built up to the extent that they begin to flake from the metallic masks or to the extent that ID mask has increased in size or the OD mask opening has decreased in size as to not allow thin films to coat an adequate surface area of the disk. At this point, the ID and OD masks with thin film coating build up are replaced with masks that have had the thin film coatings removed. This mask exchange is typically done at what is referred to as an intermediate disk loader position. The disk loader transfer arm of the coater stops at 90 degrees between its load and unload position and ID and OD masking can be replaced. The foregoing description was for larger disks, typically 120 mm in diameter. The external handling that removes a coated disk and replaces it with an uncoated disk is not part of the thin film coating machine. The mask exchange is part of the thin film machine. The 120 mm disks are typically coated and masked on only one side.

It is no longer necessary or desirable to always have disks of 120 mm in diameter. New technology has become available which is able to utilize a disk of 32 mm. Since these are substantially smaller, multiples of these small disks are coated at once. Six small disks may be placed in a disk tray. The disk tray is used to hold the smaller disks and mask the outer diameter of the smaller disk. However, because six smaller disks are coated at the same time, an additional piece of handling equipment is necessary to load and unload the 6 disks contained within a disk tray and to place the disk tray to the position of the thin film coater disk loader mechanism where a single 120 mm substrate was formerly loaded. The ID and OD masks used for the 120 mm substrate are not used when coating the 32 mm substrates. One suitable piece of handling equipment is a Steag Hama Tech disk/tray handler manufactured by Steag Hama Tech of Sternenfels, Germany.

The Steag disk/tray handler has been utilized to provide a loaded disk tray to the disk loading position of the coater. The disk trays become coated, after time, the same way that the masks did for the larger disks. Therefore, the disk trays have been exchanged at the same intermediate disk loading position as the exchange took place for the masks for the larger disks. Such an exchange, while only necessary every four to eight hours, does cause substantial disruption to the continuous, automated production of the coated disks.

SUMMARY OF THE INVENTION

In one embodiment, the invention is a method of exchanging a thin film coated tray for a clean tray for use with a thin film coater and a multiple position disk/tray handler. The disk/tray handler has a disk load position, disk transfer position, disk unload position and an intermediate position. The method includes loading a first tray, containing disks to be coated, onto the disk/tray handler at the disk load position. Then, the disk/tray handler is moved to the disk transfer position where the first tray is loaded into the thin film coater and coating the disks in the first tray takes place. Then, the first tray is returned from the coater to the disk load position. The disk/tray handler is then moved to the disk unload position and the disks that have been coated are removed. The disk/tray handler is then moved through an intermediate position to the disk load position. The previous steps are repeated until prior to the first tray needing to be replaced. The first tray, containing disks to be coated is loaded, onto the disk/tray handler at the disk load position. Then, the disk/tray handler is moved to the disk transfer position where the first tray is loaded into the thin film coater and coating the disks in the first tray takes place. Then, the first tray is returned from the coater to the disk load position. The disk/tray handler is then moved to the disk unload position and the disks that have been coated are removed. The first tray is then moved to the intermediate position. The first tray is removed from the intermediate position and a second, clean tray is placed in the intermediate position to replace the first tray.

In another embodiment, the invention is a method of exchanging a thin film coated tray for a clean tray. The method includes loading a first tray, containing disks to be coated, onto a disk/tray handler at a disk load position. The disk/tray handler is then moved to a disk transfer position. At the disk transfer position, the first tray is loaded into a film coater and the disks are coated in the first tray. The first tray is returned from the coater to the disk/tray handler. The disks that have been coated are unloaded at a disk unload position. The disk/tray handler is moved to move the first tray to an intermediate position. The first tray is removed from the disk/tray handler at the intermediate position and a second, clean tray, is placed in the intermediate position to replace the first tray, whereby production of the coater is continuous, without interruption of exchanging trays.

BRIEF DESCRIPTION OF THE DRAWINGS

FIG. 1 is a schematic representation of the coater and disk/tray handler used in the present invention.

DETAILED DESCRIPTION OF THE PREFERRED EMBODIMENT

Referring to the drawing, there is generally disclosed at 10 a thin film coater. The coater may be any suitable coater such as a Unaxis Big Sprint Coater. The coater 10 includes a rotating disk loading mechanism 11. A disk/tray handler 20, having a rotatable table 21, is provided to position a plurality of disk trays 30, each containing six disks 40 proximate the disk loading mechanism 11. The disk/tray handler may be any suitable handler such as a Steag Hamatech disk/tray handler. The table 21 of the disk/tray handler 20 rotates between four positions, positions A through D. Position A may be referred to as a load position, position B a transfer position, position C an unload position and position D an intermediate position. The positions A through D are located at 0 degrees, 90 degrees, 180 degrees and 270 degrees on the table 21 of the disk/tray handler 20. The four disk trays 30 on the table 21 rotate between the positions A through D, as previously described. The disk trays 30 includes two halves that are separated and loaded with six disks 40. The disk tray halves are then reassembled at position A. Such disk tray halves are well known in the art. The table 21 of the disk/tray handler 20 is then rotated to position B. At position B, the disk tray 30 is taken by the rotating disk loading mechanism 11 and the disk tray 30, with the disks 40, are placed in the coater 10. The disk tray 30 is circulated through the coater 10 to coat a first side of the disks 40. The disk tray 30 is then removed from vacuum part of the coater by the coater disk load mechanism, grasped by the disk/tray handler, flipped 180 degrees, and replaced onto the coater disk load mechanism, loaded into the vacuum part of the coater to coat the second side of the disks 40. The disk tray 30 is again removed from the vacuum part of the coater by the coater disk load mechanism, grasped by the disk/tray handler, flipped 180 degrees and returned to the disk tray position B. The table 21 of the disk/tray handler 20 is rotated 90 degrees to move the disk tray 30, with the now coated disks 40, to position C. At position C, the disk tray 30 is separated into halves and the double-sided thin film coated disks 40 are removed by the Steag disk/tray handler and the tray reassembled. The table is then rotated to Position D. Position D of the disk/tray handler 20 is located 180 degrees from the position B where the disk trays 30 are loaded and unloaded from the coater 10. At position D, the trays are empty of disks 40.

The disk trays 30 have a thin layer of film coated each time they cycle through the coater 10. Eventually the thin film builds up on the trays 30 to the point of flaking off, thereby causing debris detrimental to the disk performance. Alternately, the thin film would build up thick enough to shadow the outside diameter data area of the disks 40 during the coating which is detrimental to disk performance. Therefore, periodically the disk trays 30 that have a buildup of film coating need to be exchanged for clean disk trays 30. Normally this tray exchange has been done at an intermediate position of the rotating disk loading mechanism 11 of the coater 10. That is, as viewed in FIG. 1, the rotating disk loading mechanism 11 usually rotates between the coater and position B. However, when the trays 30 are exchanged, the disk loading mechanism 11 will rotate only 90 degrees and it is in that intermediate disk loading position that the trays 30 are exchanged. This is also the position where the masks for the larger disks were exchanged. However, if the tray exchange is done at the intermediate disk loading position of the coater 10, the disk tray 30 either has disks 40 that have been coated or it must not have been loaded with disks 40 from the disk/tray handler 20. If the tray 30 has disks in it when the exchange is made, there is a high probability that the disks 30 will be scrapped due to either damage by manual removal from the disk tray, contamination due to exposure to dust and debris or a lack of an easy way to place the disks back into the production flow. If, on the other hand, the tray was not loaded with disks 30 and is exchanged at the intermediate disk loading position of the coater, the tray will either have to have gone through the coater 10 without product disks or the tray introduced will have to go through the coater 10 without disks. The exchanging of the thin film coated trays 30 at the intermediate disk loading position of the coater 10 results in loss of production disks and/or results in interruption of continuous production. Further, when there is a shutdown or pause in the production to take the trays 30 out at the intermediate disk loading position, the temperature of the coater 10 may change and it is often necessary to go through the warm-up cycle again if the coater 10 cools off during the exchange. The warming up to reach equilibrium can take up to 20 minutes.

The present invention is an exchange of the thin film coated trays with clean trays 30 at position D in the disk/tray handler 20. This exchange at position D allows for the continuous, uninterrupted production of disks 30. Further, it does not result in loss of product disks or production inefficiency. The handler 20 is at position D approximately 20 seconds which easily allows for the exchange of the clean tray 30 for the thin film coated tray 30 either manually or with a robot.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A method of exchanging a thin film coated tray for a clean tray, for use with a thin film coater and a multiple position disk/tray handler, the disk/tray handler having a disk load position, disk transfer position, disk unload position and an intermediate position, comprising:

a) loading a first tray, containing disks to be coated, onto the disk/tray handler at the disk load position;

b) moving the disk/tray handler to the disk transfer position;

c) loading the first tray into the thin film coater and coating the disks in the first tray;

d) returning the first tray from the coater to the disk load position;

e) moving the disk/tray handler to the disk unload position and removing the disks that have been coated;

f) moving the disk/tray handler through the intermediate position to the disk load position;

g) repeating steps (a) through (f) until prior to the first tray needing to be replaced;

h) repeating steps (a) through (e);

i) moving the first tray to the intermediate position;

j) removing the first tray from the intermediate position; and k) placing a second, clean tray, in the intermediate position to replace the first tray.

2. A method of exchanging a thin film coated tray for a clean tray, comprising:

a) loading a first tray, containing disks to be coated, onto a disk/tray handler at a disk load position;

b) moving the disk/tray handler to a disk transfer position;

c) loading the first tray into a thin film coater;

d) coating the disks in the first tray;

e) returning the first tray from the coater to the disk/tray handler;

f) unloading the disks that have been coated at a disk unload position;

g) moving the disk/tray handler to move the first tray to an intermediate position;

h) removing the first tray from the disk/tray handler at the intermediate position; and i) placing a second, clean tray, in the intermediate position to replace the first tray, whereby production of the coater is continuous, without interruption of exchanging trays.

* * * * *